United States Patent
Hooshmand et al.

(10) Patent No.: US 10,234,511 B2
(45) Date of Patent: Mar. 19, 2019

(54) OPTIMIZING SIZING OF GRID-SCALE BATTERIES FOR FREQUENCY REGULATION SERVICES

(71) Applicant: NEC Laboratories America, Inc., Princeton, NJ (US)

(72) Inventors: Ali Hooshmand, Campbell, CA (US); Ratnesh Sharma, Fremont, CA (US)

(73) Assignee: NEC Corporation (JP)

( * ) Notice: Subject to any disclaimer, the term of this patent is extended or adjusted under 35 U.S.C. 154(b) by 819 days.

(21) Appl. No.: 14/846,149

(22) Filed: Sep. 4, 2015

(65) Prior Publication Data

US 2016/0092776 A1 Mar. 31, 2016

Related U.S. Application Data

(60) Provisional application No. 62/056,123, filed on Sep. 26, 2014.

(51) Int. Cl.
*G01R 31/36* (2006.01)
*H01M 10/42* (2006.01)

(52) U.S. Cl.
CPC .... *G01R 31/3651* (2013.01); *H01M 10/4207* (2013.01); *H01M 2220/10* (2013.01)

(58) Field of Classification Search
CPC .......... G01R 31/3651; H01M 10/4221; H01M 10/4207; H01M 10/4285; H01M 2220/10; H01M 2250/40; G06N 5/04

USPC .......................................................... 706/46
See application file for complete search history.

(56) References Cited

U.S. PATENT DOCUMENTS

| | | | | |
|---|---|---|---|---|
| 2013/0024044 A1* | 1/2013 | Sharma | .................... | H02J 3/14 700/297 |
| 2013/0030784 A1* | 1/2013 | Viassolo | ................ | G06Q 10/00 703/18 |
| 2014/0039710 A1* | 2/2014 | Carter | .................... | G06Q 10/06 700/291 |
| 2016/0218505 A1* | 7/2016 | Krupadanam | ......... | G06Q 10/06 |

OTHER PUBLICATIONS

Mercier P. et al., "Optimizing a Battery Energy Storage System for Frequency Control Application in an Isolated Power System", IEEE Transactions on Power Systems, vol. 24, No. 3, Aug. 2009.*

* cited by examiner

*Primary Examiner* — Dave Misir
(74) *Attorney, Agent, or Firm* — Joseph Kolodka

(57) ABSTRACT

Systems and methods for optimal sizing of one or more grid-scale batteries for frequency regulation service, including determining a desired battery output power for the one or more batteries for a particular period of time. A battery size is optimized for the one or more batteries for the particular period of time, and the optimizing is repeated using different time periods to generate a set of optimal battery sizes based on at least one of generated operational constraints or quality criteria constraints for the one or more batteries. A most optimal battery is selected from the set of optimal battery sizes.

1 Claim, 4 Drawing Sheets

OPTIMIZING SIZING OF GRID-SCALE BATTERIES FOR FREQUENCY REGULATION SERVICES

RELATED APPLICATION INFORMATION

This application claims priority to provisional application No. 62/056,123 filed Sep. 26, 2014, the contents of which are incorporated herein by reference.

BACKGROUND OF THE INVENTION

Technical Field

The present invention relates generally to management of grid-scale Energy Storage Systems (ESSs), and more particularly, to a system and method for determining optimal sizing of grid-scale batteries for Frequency Regulation (FR) services.

Description of the Related Art

Grid-connected energy storage systems (ESSs) are a fast growing global market. Recently, increases in the penetration of renewable energy resources into grid-connected ESSs have presented a challenge to the traditional design and operation of electric power systems. The existing power grid was designed for centralized power generation with unidirectional power flow. With renewable energy (or any other type of distributed generation of electricity), power is effectively generated everywhere and flows in multiple directions. However, the intermittent and highly variable nature of distributed generation causes power quality and/or reliability issues, which leads to increased energy costs.

Energy Storage Systems (ESSs) have been employed to cope with the intermittent nature of Renewable Energy Resources (RERs) and loads in energy systems (e.g., batteries). Considering the high capital costs of energy storage technologies, taking into account the effects of uncertainties in optimal sizing of ESSs for various applications is of particular importance. Thus, some systems and methods have attempted to optimally size ESS batteries using various techniques, including a trial and error approach, an analytical approach, a worst case scenario approach, and an empirical probability density function (PDF) based approach. However, these methods have deficiencies, including, for example, that analytical approaches don't capture the stochastic nature of the system and probabilistic approaches require PDFs of uncertain parameters.

SUMMARY

A computer implemented method for optimal sizing of one or more grid-scale batteries, including determining a desired battery output power for the one or more batteries for a particular period of time. A battery size is optimized for the one or more batteries for the particular period of time, and the optimizing is repeated using different time periods to generate a set of optimal battery sizes based on at least one of generated operational constraints or quality criteria constraints for the one or more batteries. A most optimal battery is selected from the set of optimal battery sizes.

A system for optimal sizing of one or more grid-scale batteries, including a power determiner to establish a desired battery output power for the one or more batteries for a particular period of time. An optimizer determines an optimal minimum battery size for the one or more batteries for the particular period of time and generates a set of optimal battery sizes by determining an optimal minimum battery size for one or more different periods of time based on at least one of generated operational constraints or quality criteria constraints for the one or more batteries. A selector chooses a most optimal battery from the set of optimal battery sizes.

A computer-readable storage medium including a computer-readable program, wherein the computer-readable program when executed on a computer causes the computer to perform the steps of determining a desired battery output power for one or more grid-scale batteries for a particular period of time. A battery size is optimized for the one or more batteries for the particular period of time, and the optimizing is repeated using different time periods to generate a set of optimal battery sizes based on at least one of generated operational constraints or quality criteria constraints for the one or more batteries. A most optimal battery is selected from the set of optimal battery sizes These and other advantages of the invention will be apparent to those of ordinary skill in the art by reference to the following detailed description and the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
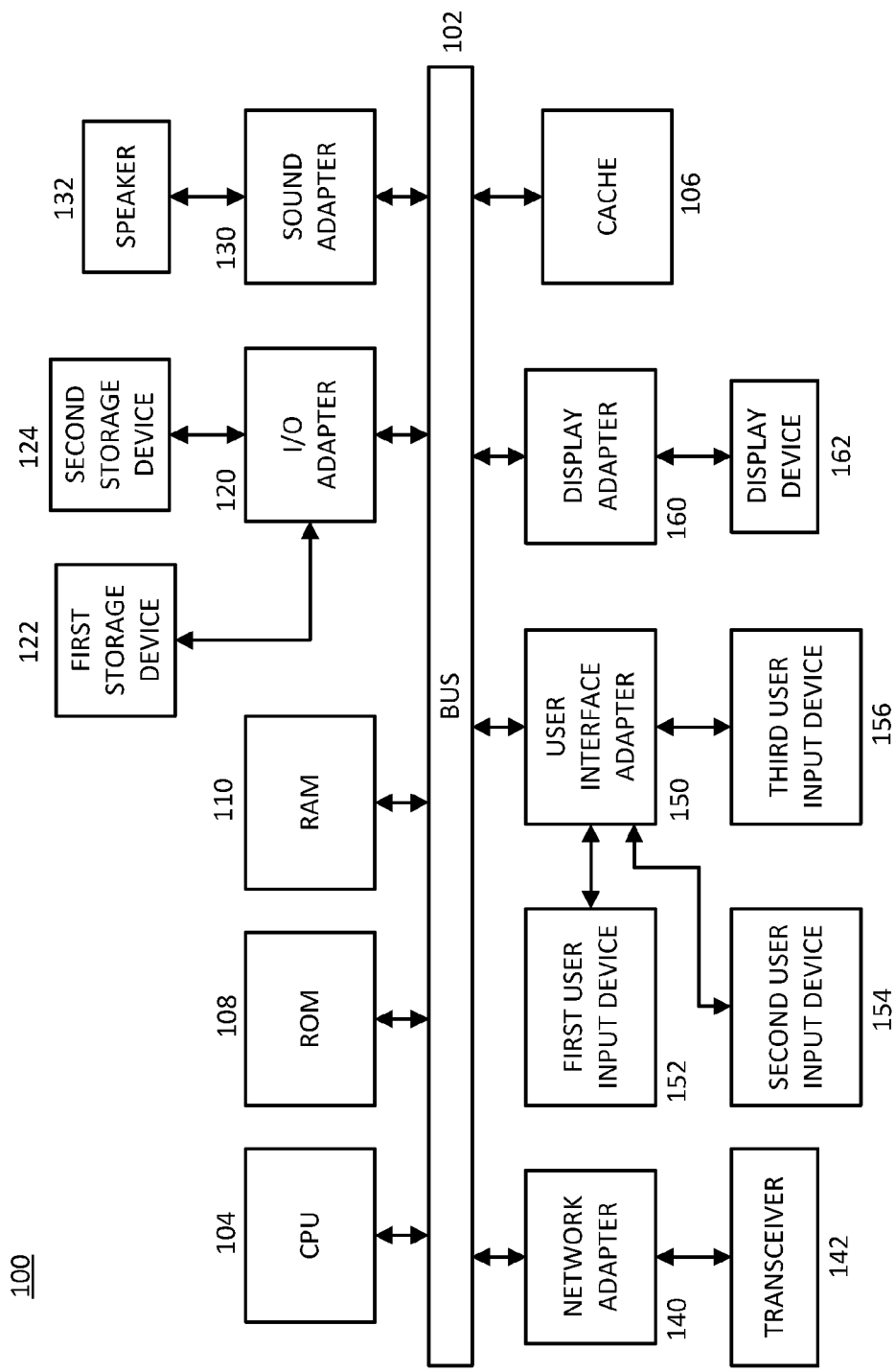
FIG. 1 shows an exemplary processing system to which the present principles may be applied, in accordance with an embodiment of the present principles.

The present principles are directed to systems and methods for determining optimal sizing of grid-scale batteries for Frequency Regulation (FR) services according to various embodiments. In a particularly useful embodiment, a desired battery output power for a particular period of time (e.g., a week), operational constraints (e.g., model of Energy Storage System (ESS), and/or quality criteria constraints (e.g., power change, required active power, etc.) may be employed as input to an optimizer for determining optimal battery size for one or more ESSs according to the present principles.

In one embodiment, an objective function and model constraints may be employed to perform finite time optimization to determine an optimal size of batteries in one or more ESSs, and the optimization may be iteratively repeated for a second, longer time period. The results of the iterative optimization may be analyzed, and the most optimal battery size for providing acknowledged regulation service (e.g., Frequency Regulation (FR) service) may be determined and selected based on the set of optimal battery sizes generated by the iterative optimization according to the present principles.

It should be understood that embodiments described herein may be entirely hardware or may include both hardware and software elements, which includes but is not limited to firmware, resident software, microcode, etc. In a preferred embodiment, the present invention is implemented in hardware. The present invention may be a system, a method, and/or a computer program product. The computer program product may include a computer readable storage medium (or media) having computer readable program instructions thereon for causing a processor to carry out aspects of the present invention.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Referring now to the drawings in which like numerals represent the same or similar elements and initially to FIG. 1, an exemplary processing system 100, to which the present principles may be applied, is illustratively depicted in accordance with an embodiment of the present principles. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Figure 4:
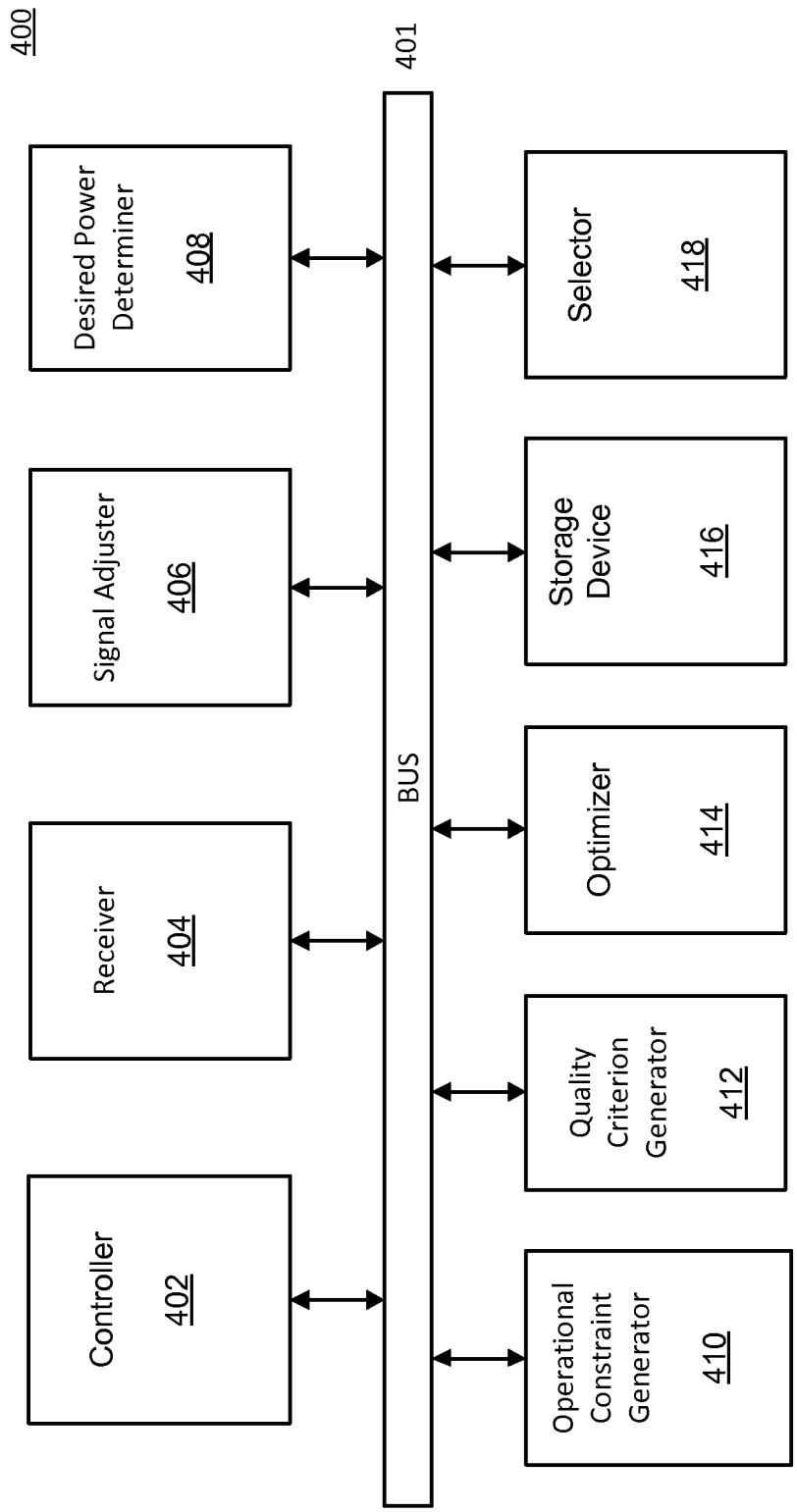
FIG. 4 shows an exemplary system for determining optimal sizing of grid-scale batteries in one or more Energy Storage Systems (ESSs), in accordance with an embodiment of the present principles.

Moreover, it is to be appreciated that system 400 described below with respect to FIG. 4, is a system for implementing respective embodiments of the present principles. Part or all of processing system 100 may be implemented in one or more of the elements of system 400.

Figure 2:
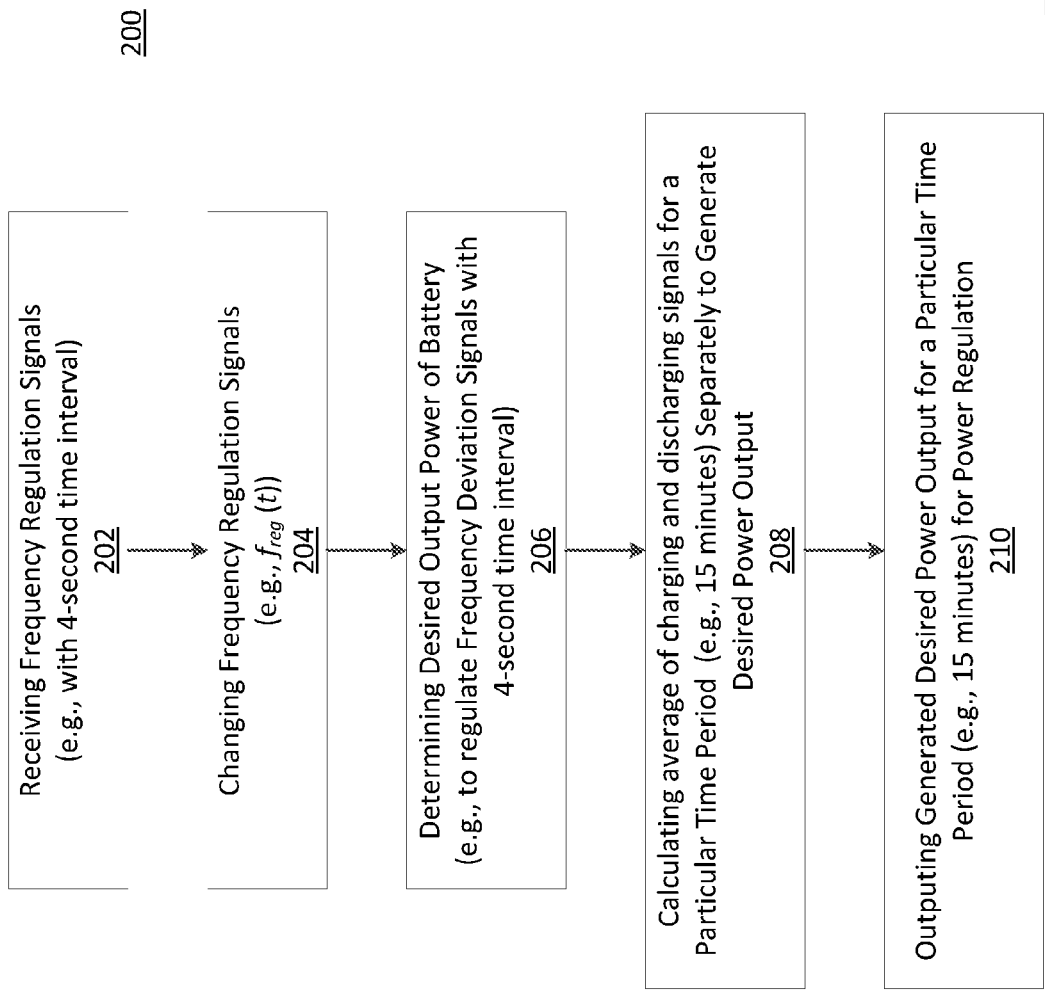
FIG. 2 shows an exemplary method for determining desired battery power in one or more Energy Storage Systems (ESSs) for a particular time period, in accordance with an embodiment of the present principles.
Figure 3:
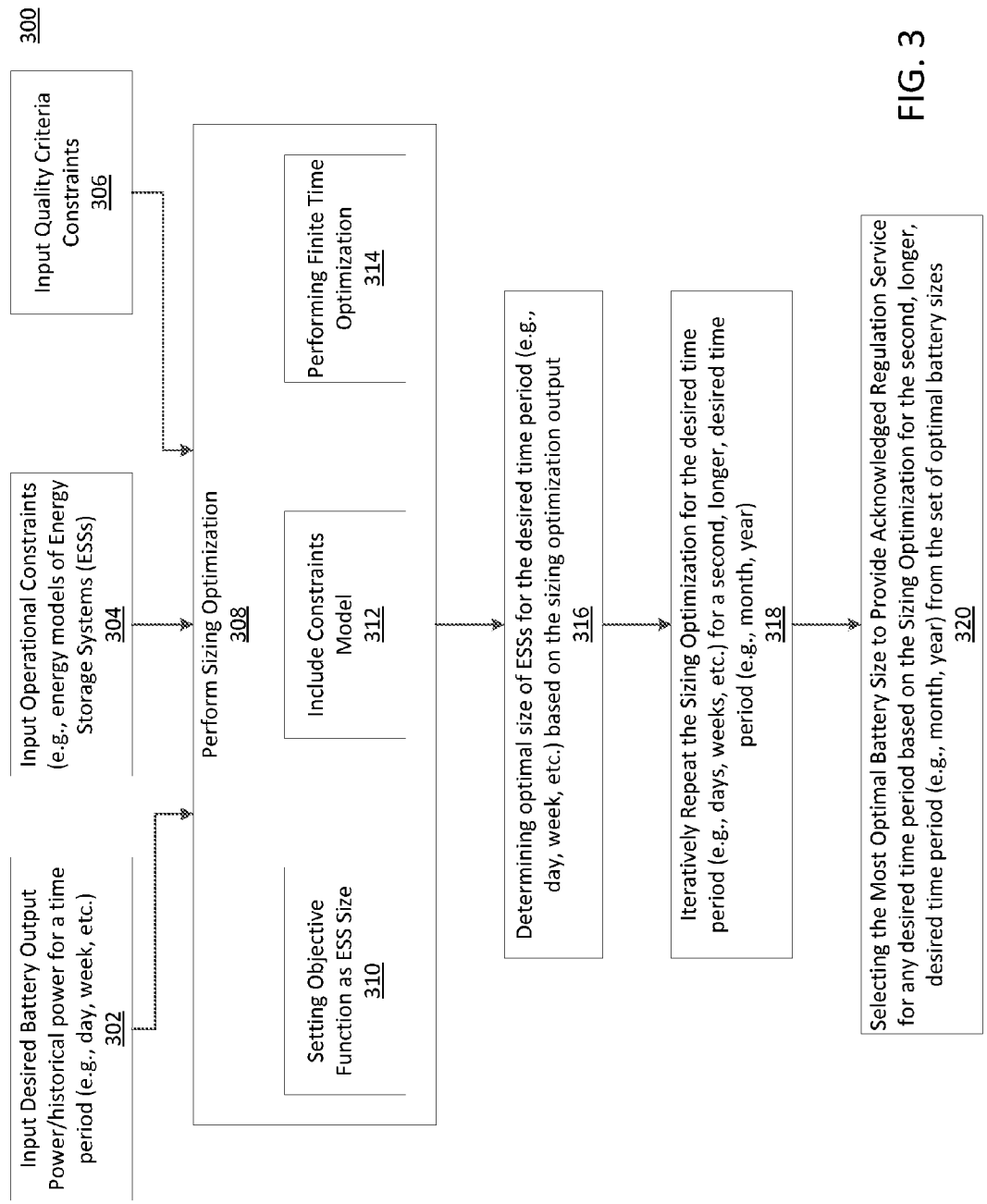
FIG. 3 shows an exemplary method for determining optimal sizing of grid-scale batteries in one or more Energy Storage Systems (ESSs), in accordance with an embodiment of the present principles.

Further, it is to be appreciated that processing system 100 may perform at least part of the method described herein including, for example, at least part of methods 200 and 300 of FIGS. 2 and 3, respectively. Similarly, part or all of system 400 may be used to perform at least part of methods 200 and 300 of FIGS. 2 and 3, respectively.

Referring now to FIG. 2, an exemplary method 200 for determining desired battery power in one or more Energy Storage Systems (ESSs) for a particular time period is illustratively depicted in accordance with an embodiment of the present principles. For simplicity of illustration, the method 200 will be described in terms of a 4-second time interval (e.g., for receiving frequency regulation signals), and the desired battery power output will be described in terms of a 15-minute interval, but the present principles may be applied to any time period in accordance with various embodiments.

In one embodiment, frequency regulation (FR) signals may be received with, for example, a 4-second time (t) interval in block 202. In block 204, the FR signals may be adjusted based on ±10 mHz deadband, and any deviation less than ±10 mHz may be considered as zero, and the adjusted FR signals may be represented as $f_{reg}(t)$ according to the present principles. In block 206, a desired output power of one or more batteries in one or more ESSs may be determined to regulate frequency deviation signals with a 4-second time interval, and may be determined as follows:

$$P_{desired}^{4\ second}(t) = -5 \times 8 \times (f_{reg}(t))$$

where, if $P_{desired}^{4\ second}(t) > 0$ = Discharging signal, and if $P_{desired}^{4\ second}(t)<0$=Charging signal In one embodiment, for each 15-minute interval, the average of charging signals (e.g., $P_{desired}^{4\ second}(t)<0$) and discharging signals (e.g., $P_{desired}^{4\ second}(t)>0$) may be calculated separately to generate a desired power for a 15-minute interval (e.g., $P_{desired}^{15\ minute}(t)$) in block 208, and the desired power for a 15-minute interval may be output in block 210 for use as input for optimizing battery sizing for one or more ESSs (as described in further detail herein below). In some embodiments, the desired power for a 15-minute interval output in block 210 may be employed for determining battery sizing for longer optimization horizons (e.g., one week, one month, one year, etc.) according to the present principles.

Referring now to FIG. 3, with continued reference to FIG. 2, an exemplary method 300 for determining optimal sizing of grid-scale batteries in one or more Energy Storage Systems (ESSs) is illustratively depicted in accordance with an embodiment of the present principles. In one embodiment, an optimal size for a battery may be the minimum sized battery capable of performing all requested functions of an ESS. In one embodiment, sizing optimization may be performed in block 308 based on received input from blocks 302, 304, and/or 306.

In one embodiment, the input received from block 302 may include a desired battery output power for a particular time period (e.g., minutes, days, weeks, etc.) and/or historical power use for a particular time period (e.g., minutes, days, weeks, etc.). The desired battery output power input from block 302 may be determined by the method 200 described above with reference to FIG. 2 and/or historical power use according to one embodiment. In block 304, operational constraints (e.g., energy models of ESSs, state of charge (SOC) difference, supplying regulation signals, etc.), and in block 306, quality criteria constraints (e.g., active power change, required active power, etc.) may be input into block 308 for performing sizing optimization for one or more batteries in one or more ESSs according to the present principles.

In some embodiments, operational constraints input from block 304 may include, for example, battery power to regulate frequency, battery SOC difference, and/or battery SOC limitations according to the present principles. For example, battery power to regulate frequency may be determined as follows:

$$P_{batt}(t)=P_{regulation}(t)-P_{deviation}(t);$$

battery SOC difference may be determined as follows:

$$soc(t+1)=soc(t)-P_{batt}(t)\times \Delta t;\text{ and}$$

battery SOC limitations may be determined as follows:

$$soc_{min}^{\%}\times size_{batt}\leq soc(t)\leq soc_{max}^{\%}\times size_{batt},$$

where $size_{batt}$ represents battery size, $P_{batt}$ represents battery output power, $P_{regulation}$ represents desired power to regulate frequency, $P_{deviation}$ represents deviation of battery power from desired power, and soc represents a battery state of charge. In some embodiments, it is desirable for the energy level of the one or more ESSs to remain between a given minimum and maximum state of charge, and power capacity of the ESSs may be more than the charging and discharge powers of the ESSs at all times according to the present principles.

In one embodiment, the quality criteria constraints input from block 306 for optimization in block 308 may include quality criterion of Active Power Change and/or of Required Active Power according to the present principles. In one embodiment, the quality criterion of Active Power Change may be determined as follows:

$$Sign(P_{batt}(t))=(SignP_{regulation}(t)),$$

where battery power may be "in the direction" of desired power for regulation. In some embodiments, desired power (e.g., $P_{regulation}$) may be either negative (e.g., charging) or positive (e.g., discharging). In one embodiment, "in the direction" may indicate that the sign of actual battery output power (e.g., $P_{batt}$) at each time step may be equal to the desired power (e.g., $P_{regulation}$), and if $P_{regulation}$ is positive (e.g., discharge), $P_{batt}$ may not be negative (e.g., charge), but should also be positive (e.g., discharge), and vice versa according to the present principles. In an illustrative embodiment, a battery may be desired to provide at least 60% of the absolute value of the desired power, which may be represented as follows:

$$|P_{batt}(t)|\geq 0.6\times |P_{regulation}(t)|.$$

In one embodiment, the quality criteria of Required Active Power input from block 306 may be employed to limit battery power deviation from average deviation, and may be determined as follows:

$$P_{regulation}(t)-0.8\leq P_{batt}(t)-P_{50\ Hz}\leq P_{regulation}(t)+0.8,$$
where $$P_{50\ Hz}=average_{15\ minutes}(P_{batt})-average_{15\ minutes}(P_{regulation}),\text{ and}$$

$$0.8=10\%\ *\text{Battery Maximum power (8 MW)},$$
according to the present principles.

In an illustrative embodiment, the performance of a battery system in regulating frequency may be measured based on the average of battery output power during, for example, 15-minute time intervals. Thus, the battery may not follow the desired power at each time step, and an inequality equation (e.g., $P_{regulation}(t)-0.8\leq P_{batt}(t)-P_{50\ Hz}\leq P_{regulation}(t)+0.8$) may be employed to limit the battery power deviation at each time step according to various embodiments of the present principles.

In one embodiment, during sizing optimization in block 308, an objective function may be set in block 310 to determine an optimal minimum battery size for one or more ESSs according to the present principles. Desired battery output power from block 302, operational constraints from block 304, and/or quality criteria constraints from block 306 may be included in block 312 for optimization, and finite time optimization (e.g., {t . . . T}) may be performed for a particular period of time/horizon (e.g., a day, a week, etc) in block 314 for determining optimal battery size for the particular period of time/horizon (e.g., a day, a week, etc.), and the optimal size determined in block 308 may be output and stored in block 316 using, for example, an optimization solver to determine an optimal point according to the present principles.

In one embodiment, the sizing optimization may determine the minimum (e.g., optimal) sized battery for one or more ESSs in block 308 according to the following method:

$$\text{Min}\{size_{batt}\}:$$

subject to:

$$\left.\begin{array}{l}P_{batt}(t)=P_{regulation}(t)-P_{deviation}(t)\\ soc(t+1)=soc(t)-P_{batt}(t)\times \Delta t\\ soc_{min}^{\%}\times size_{batt}\leq soc(t)\leq soc_{max}^{\%}\times size_{batt}\end{array}\right\},$$

representing operational constraints;

$$\left.\begin{array}{l}\frac{P_{regulation}(t)}{|P_{regulation}(t)|} \times P_{deviation}(t) \leq 0.4 \times |P_{regulation}(t)| \\ \text{Sign}(P_{deviation}(t)) = (\text{Sign } P_{regulation}(t)) \\ \text{Sign}(P_{batt}(t)) = (\text{Sign } P_{regulation}(t))\end{array}\right\} \equiv$$

$$|P_{batt}(t)| \geq 0.6 \times |P_{regulation}(t)|,$$

representing quality criteria of active power change; and $$\left.\begin{array}{l}P_{regulation}(t) - 0.8 \leq P_{batt}(t) - P_{50\ Hz} \leq P_{regulation}(t) + 0.8 \\ P_{50\ Hz} = \text{average}_{15\ minutes}(P_{batt}) - \text{average}_{15\ minutes}(P_{regulation})\end{array}\right\},$$

representing quality criteria of the required active power. In one embodiment, the above optimization may determine a minimum battery size that may satisfy all constraints that the system is "subject to" using an optimization solver according to the present principles.

In some embodiments, the size of input data for a long period of time (e.g., a year) may be too large to efficiently determine a battery size in block 318, and the present principles may be employed to generate signals with the energy and dynamic behavior of, for example, the 4-second data in, for example, 15-minute intervals, and the sizing optimization may be repeated for a second (or third, fourth, etc.), longer period of time (e.g., a week, a month, etc.), and may store the sizing data in a storage device. In block 320, a most optimal battery size may be selected from the optimal battery sizes iteratively determined in block 318 and stored in the storage device to provide acknowledged regulation service for another longer desired time period (e.g., a month, a year, etc.) according to one embodiment of the present principles.

Referring now to FIG. 4, an exemplary system 400 for determining optimal sizing of grid-scale batteries in one or more Energy Storage Systems (ESSs) is illustratively depicted in accordance with an embodiment of the present principles.

The system 400 may include a controller 402, a receiver 404, a signal adjuster 406, a desired power determiner 408, an operational constraint generator 410, a quality criterion generator 412, an optimizer 414, a storage device 416, and/or a selector 418 according to various embodiments of the present principles.

While many aspects of system 400 are described in singular form for the sakes of illustration and clarity, the same can be applied to multiples ones of the items mentioned with respect to the description of system 400. For example, while a single receiver 404 is described, more than one receiver 404 can be used in accordance with the teachings of the present principles, while maintaining the spirit of the present principles. Moreover, it is appreciated that the receiver 404 is but one aspect involved with system 400 than can be extended to plural form while maintaining the spirit of the present principles.

In an embodiment, a controller 402 may be employed for controlling one or more one or more portions of the system 400, including, for example, a battery size optimizer 414 during sizing optimization in accordance with the present principles. In one embodiment, a receiver 404 may receive frequency regulation (FR) signals as input to the system 400. In block 406, the FR signals may be adjusted based on ±10 mHz deadband, and any deviation less than ±10 mHz may be considered as zero, and the adjusted FR signals may be represented as $f_{reg}(t)$ according to the present principles.

In block 408, a desired output power of one or more batteries in one or more ESSs may be determined to regulate frequency deviation signals with a 4-second time interval, and may be determined as follows:

$$P_{desired}^{4\ second}(t) = -5 \times 8 \times (f_{reg}(t))$$

where, if $P_{desired}^{4\ second}(t) > 0$ = Discharging signal, and if $P_{desired}^{4\ second}(t) < 0$ = Charging signal.

In one embodiment, for each 15-minute interval, the average of charging signals (e.g., $P_{desired}^{4\ second}(t) < 0$) and discharging signals (e.g., $P_{desired}^{4\ second}(t) > 0$) may be calculated separately to generate a desired power for a 15-minute interval (e.g., $P_{desired}^{15\ minute}(t)$) in block 408, and the desired power for a 15-minute interval may be output for use as input for optimizing battery sizing for one or more ESSs. In some embodiments, the desired power for a 15-minute interval determined in block 408 may be employed for determining battery sizing for longer optimization horizons (e.g., one week, one month, one year, etc.) according to the present principles.

In one embodiment, an operational constraint generator 410 may be employed to generate operational constraints (e.g., energy models of ESSs, state of charge (SOC) difference, supplying regulation signals, etc.), as described in detail above with reference to FIG. 3.

In some embodiments, operational constraints generated by the generator 410 may include, for example, battery power to regulate frequency, battery SOC difference, and/or battery SOC limitations according to the present principles. For example, battery power to regulate frequency may be determined as follows:

$$P_{batt}(t) = P_{regulation}(t) - P_{deviation}(t);$$

battery SOC difference may be determined as follows:

$$soc(t+1) = soc(t) - P_{batt}(t) \times \Delta t;\ \text{and}$$

battery SOC limitations may be determined as follows:

$$soc_{min}\% \times size_{batt} \leq soc(t) \leq soc_{max}\% \times size_{batt},$$

where $size_{batt}$ represents battery size, $P_{batt}$ represents battery output power, $P_{regulation}$ represents desired power to regulate frequency, $P_{deviation}$ represents deviation of battery power from desired power, and soc represents a battery state of charge.

In one embodiment, a quality criterion generator 412 may be employed to generate quality criteria constraints (e.g., active power change, required active power, etc.), as described in detail above with reference to FIG. 3. In some embodiments, the quality criteria constraints determined by the quality criterion generator 412 may be employed as input to the optimizer 414 for battery size optimization, and may include, for example, quality criterion of Active Power Change and/or of Required Active Power according to the present principles. In one embodiment, the quality criterion of Active Power Change may be determined as follows:

$$\text{Sign}(P_{batt}(t)) = (\text{Sign} P_{regulation}(t)),$$

where battery power may be in the direction of desired power for regulation. In one embodiment, a battery may be desired to provide at least 60% of the absolute value of the desired power, which may be represented as follows:

$$|P_{batt}(t)| \geq 0.6 \times |P_{regulation}(t)|.$$

In one embodiment, the quality criteria of Required Active Power input from block 306 may be employed to limit battery power deviation from average deviation, and may be determined as follows:

$$P_{regulation}(t)-0.8 \leq P_{batt}(t)-P_{50\ Hz} \leq P_{regulation}(t)+0.8,$$
where $P_{50\ Hz}$=average$_{15\ minutes}(P_{batt})$-average$_{15\ minutes}$ $(P_{regulation})$, according to the present principles.

In one embodiment, an optimizer 414 may receive input from the power determiner 408, operational constraint generator 410, and/or quality criterion generator 412 for determining an optimal battery size for a particular ESS, and an objective function of the optimizer 414 may be ESS battery size according to the present principles. The optimizer 414 may determine an optimal battery size for any period of time, as described above with reference to the sizing optimization in block 308 of FIG. 3, and the output from the optimizer may be stored in a storage device 416. The optimizer 414 may iteratively repeat the optimization method (e.g., for different time periods) to generate a set of optimal battery sizes for different time periods for one or more ESSs, and the set of optimal battery sizes may be stored in a storage device. A selector 416 may select the most optimal battery size for a particular period of time (e.g., week, month, year, etc.) from the set of optimal battery sizes stored in the storage device 416, and the optimally sized battery may then be installed in one or more ESSs according to various embodiments of the present principles.

In the embodiment shown in FIG. 4, the elements thereof are interconnected by a bus 401. However, in other embodiments, other types of connections can also be used. Moreover, in an embodiment, at least one of the elements of system 400 is processor-based and/or a logic circuit. Further, while one or more elements may be shown as separate elements, in other embodiments, these elements can be combined as one element. The converse is also applicable, where while one or more elements may be part of another element, in other embodiments, the one or more elements may be implemented as standalone elements. These and other variations of the elements of system 400 are readily determined by one of ordinary skill in the art, given the teachings of the present principles provided herein, while maintaining the spirit of the present principles.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an appendix to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

What is claimed is:

1. A method implemented by a computer for optimal sizing of one or more grid-scale batteries for frequency regulation service, the method comprising:

by the computer iteratively repeating:

receiving frequency regulation signals at intervals of at least 4-seconds;

adjusting the received frequency regulation signals based upon a ±10 mHZ deadband such that any deviation less than ±10 mHZ is considered zero, wherein said adjusted signal is indicated by $f_{reg}(t)$;

determining for each 15 minute interval a desired battery output power for the one or more batteries for the at least 4-second time interval according to the following:

$$P_{desired}^{4sec}(t)=-5 \times 8 \times (f_{reg}(t));$$

wherein $P_{desired}^{4sec}(t)>0$=discharging signal, and if $P_{desired}^{4sec}(t)<0$=charging signal;

determining, for each 15-minute interval, $P_{desired}^{15\ min}(t)$ a desired battery output power, from the separate averages of both the charging and discharging signals;

iteratively determining a minimum battery size for the one or more batteries according to an optimization of the following:

Min{size$_{batt}$}:

subject to:

$$\left. \begin{array}{c} P_{batt}(t) = P_{regulation}(t) - P_{deviation}(t) \\ soc(t+1) = soc(t) - P_{batt}(t) \times \Delta t \\ soc_{min}^{\%} \times size_{batt} \leq soc(t) \leq soc_{max}^{\%} \times size_{batt} \end{array} \right\},$$

representing operational constraints;

$$\left. \begin{array}{c} \frac{P_{regulation}(t)}{|P_{regulation}(t)|} \times P_{deviation}(t) \leq 0.4 \times |P_{regulation}(t)| \\ \text{Sign}(P_{deviation}(t)) = (\text{Sign } P_{regulation}(t)) \\ \text{Sign}(P_{batt}(t)) = (\text{Sign } P_{regulation}(t)) \end{array} \right\} \equiv$$

$$|P_{batt}(t)| \geq 0.6 \times |P_{regulation}(t)|,$$

representing quality criteria of active power change; and $$\left. \begin{array}{c} P_{regulation}(t) - 0.8 \leq P_{batt}(t) - P_{50\ Hz} \leq P_{regulation}(t) + 0.8 \\ P_{50\ Hz} = \text{average}_{15\ minutes}(P_{batt}) - \text{average}_{15\ minutes}(P_{regulation}) \end{array} \right\},$$

representing quality criteria of the required active power;

wherein $P_{batt}$ represents battery output power;

$P_{regulation}$ represents desired power to regulate frequency;

$P_{deviation}$ represents deviation of battery power from desired power;

soc represents state of charge;

size$_{batt}$ represents the battery size and sign is the sign of the function;

and generating based on the interative optimization a set of grid scale batteries that meet the determined minimal size; and selecting a battery from the set of grid scale batteries that meet a most optimal battery size for a particular period of time.

* * * * *